US006812069B2

United States Patent
Tseng et al.

(10) Patent No.: US 6,812,069 B2
(45) Date of Patent: Nov. 2, 2004

(54) METHOD FOR IMPROVING SEMICONDUCTOR PROCESS WAFER CMP UNIFORMITY WHILE AVOIDING FRACTURE

(75) Inventors: Tung-Ching Tseng, Taipei (TW); Syun-Ming Jang, Hsin-Chu (TW); Chih-Hsiang Yao, Taipei (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/322,691

(22) Filed: Dec. 17, 2002

(65) Prior Publication Data

US 2004/0115925 A1 Jun. 17, 2004

(51) Int. Cl.[7] ....................... H01L 21/82; H01L 21/336; H01L 21/4763
(52) U.S. Cl. ........................ 438/129; 438/289; 438/626
(58) Field of Search ................... 438/129, 289, 438/626, 690, 691, 710, 758, 926

(56) References Cited

U.S. PATENT DOCUMENTS

| 6,531,403 | B2 | * | 3/2003 | Ezaki ......................... 438/710 |
| 6,593,226 | B2 | * | 7/2003 | Travis et al. ................. 438/626 |
| 6,611,045 | B2 | * | 8/2003 | Travis et al. ................. 438/129 |
| 6,638,863 | B2 | * | 10/2003 | Wang et al. ................. 438/690 |

* cited by examiner

Primary Examiner—John F. Niebling
Assistant Examiner—Walter L. Lindsay, Jr.
(74) Attorney, Agent, or Firm—Tung & Associates

(57) ABSTRACT

A method for improving CMP polishing uniformity and reducing or preventing cracking in a semiconductor wafer process surface by reducing stress concentrations adjacent to dummy features including providing a semiconductor wafer process surface including active features and dummy features formed adjacently to the active features to improve a CMP polishing uniformity said dummy features each shaped to define an enclosed area in said semiconductor wafer process surface plane comprising at least 5 corner portions; and, performing a CMP process on said semiconductor wafer process surface.

19 Claims, 2 Drawing Sheets

METHOD FOR IMPROVING SEMICONDUCTOR PROCESS WAFER CMP UNIFORMITY WHILE AVOIDING FRACTURE

FIELD OF THE INVENTION

This invention generally relates to methods for chemical mechanical polishing (CMP) and more particularly to a method for forming dummy features within selected portions of a semiconductor wafer including die to improve polishing uniformity in a CMP process and avoid fracture of a dielectric insulating layer.

BACKGROUND OF THE INVENTION

Sub-micron multi-level metallization is one of the key technologies for the next generation of ultra large scale integration (ULSI). The multilevel interconnects that lie at the heart of this technology require planarization of interconnect features formed in high aspect ratio apertures, including contacts, vias, metal interconnect lines and other features. Reliable formation of these interconnect features is very important to the success of ULSI and to the continued effort to increase circuit density and quality on individual substrates and die.

Planarization is increasingly important in semiconductor manufacturing techniques. As device sizes decrease, the importance of achieving high resolution features through photolithographic processes correspondingly increases thereby placing more severe constraints on the degree of planarity required of a semiconductor wafer processing surface. Excessive degrees of surface non-planarity will undesirably affect the quality of several semiconductor manufacturing process including, for example, photolithographic patterning processes, where the positioning the image plane of the process surface within an increasingly limited depth of focus window is required to achieve high resolution semiconductor feature patterns.

Chemical mechanical polishing (CMP) is increasingly being used as a planarizing process for semiconductor device layers, especially for devices having multi-level design and smaller semiconductor fabrication processes, for example, having line widths below about 0.25 micron. CMP planarization is typically used several different times in the manufacture of a multi-level semiconductor device, including planarizing levels of a device containing both dielectric and metal portions to achieve global planarization for subsequent processing of overlying levels. For example, CMP is used to remove excess metal after filling conductive metal interconnect openings formed in dielectric insulating layers with metal to form features such as vias and trench lines. The vias and trench lines electrically interconnect the several levels and areas within a level that make up a multi-level semiconductor device.

Several semiconductor feature defects can be associated with CMP polishing. For example, in CMP polishing of a high polish rate materials such as an insulating dielectric material or soft metal such as copper, uniform polishing or local planarization is highly dependent on feature surface area and density. For example, the material removal rate is proportionally faster with the surface area of the high polish rate material leading to dishing. In addition, for low polish rate materials such as metal nitrides or carbides, a high metal pattern density (smaller pitch) adjacent to low polish rate materials such as nitrides can lead to erosion. The effect of non-uniform material removal whether due to dishing or erosion results in non-uniform topographies over the wafer surface thereby detrimentally affecting subsequent processes such as photolithographic patterning and feature etching. For example, wide areas of metal patterning such as bonding pads and wide interconnect metal lines as well as to a relatively high density of metal interconnect lines (trench lines), for example, in damascene structure metallization layers, can lead to local non-uniformities due to dishing or erosion. Polishing non-uniformity is frequently present within individual die and is frequently referred to as within-die (WID) non-uniformity. For example, such WID non-uniformity can lead to excess removal of wide area metal interconnects and bonding pads adversely affecting subsequent processes and electrical inter-connectivity.

One approach to improve WID uniformity has been to introduce dummy features, for example dummy features in relatively featureless areas of a die. In the prior art rectangular shaped features have been used since they are easily patterned and formed in parallel with active areas such as rectangular bonding pads. For example, rectangular dummy features about 3 microns to about 5 microns on an edge are provided surrounding wide area metal features such as bonding pads in otherwise relatively featureless areas to improve the overall polishing uniformity between the relatively dense feature areas and relatively featureless areas within the die. One problem with the prior art method of producing rectangular shaped dummy features is the tendency for stress fields created by an applied load, for example during CMP polishing, to concentrate at the corners of such features. As a result of the concentration of stress force fields at sharply directionally divergent material interface contours (corners), such as rectangular metal filled dummy features formed in a dielectric insulating layer, the fracture strength of the dielectric insulating layer is exceeded at the corner areas of the dummy features, causing the initiation and catastrophic propagation of cracks, also known a brittle fracture, through the dielectric insulating layer.

The problem is exacerbated by the use of low-k (low dielectric constant) material used for the dielectric insulating layers also referred to as inter-metal dielectric (IMD) layers, for example, having a dielectric constant less than about 3.2. Many of the low-k materials are designed with a higher degree of porosity or made of organic materials with less robust mechanical properties to allow the achievement of lower dielectric constants. A shortcoming of using low-k materials is that the less robust mechanical properties of the low-k IMD layers, such as strength and hardness, make the low-k IMD layers more susceptible to brittle fracture compared to traditional higher k materials such as silicon dioxide. For example, low-k materials are more prone to brittle fracture at a given applied load or when stressed a given amount, for example, when a semiconductor wafer process is subjected to stresses induced by CMP processes.

There is therefore a need in the semiconductor processing art to develop a method to improve CMP polishing uniformity whereby fracturing or cracking of low-k dielectric insulating layers including dummy semiconductor features can be reduced or prevented during the application of loads such as those attributable to CMP processes.

It is therefore an object of the invention to provide a method to improve CMP polishing uniformity whereby fracturing of low-k dielectric insulating layers including dummy semiconductor features can be reduced or prevented during the application of loads such as those attributable to CMP processes while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for improving CMP polishing uniformity and reducing or preventing cracking in a semiconductor wafer process surface by reducing stress concentrations adjacent to dummy features.

In a first embodiment, the method includes providing a semiconductor wafer process surface including active features and dummy features formed adjacently to the active features to improve a CMP polishing uniformity said dummy features each shaped to define an enclosed area in said semiconductor wafer process surface plane comprising at least 5 corner portions; and, performing a CMP process on said semiconductor wafer process surface.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

The method of the present invention by explanation only and not by way of limitation is explained with reference to the formation of copper filled features such as wide area metal filled features including bonding pads and wide area interconnects (trench lines). It will be appreciated however that the method of the present invention may be practiced in connection with the formation of any semiconductor feature including a relatively wide surface areas of metal features or a high density of metal features formed in a dielectric insulating layer surrounded by relatively featureless areas of areas of relatively lower density. Although the method of the present invention is explained with reference to forming dummy features in an wafer surface area, such as individual die including areas of relatively low density compared to relatively higher density active feature areas, it will be appreciated that the dummy features may be added adjacent to alignment mark areas in relatively featureless areas or areas of relatively low active feature density including wafer surface areas between die and at the peripheral portion of a process wafer. The method of the present invention is applicable in general to the formation of dummy features in a semiconductor wafer CMP polishing surface to make a feature density more uniform or alternatively stated, to approach a more uniform ratio of material polishing area per unit polishing surface area with respect to different materials with contrasting polishing rates for improving a CMP polishing process.

It will be appreciated that although the method of the present invention is explained with respect to the manufacture of an exemplary level of a semiconductor device that the method may be repeated in each level of a multi-level device where a CMP process will be performed. Although an exemplary embodiment is explained in terms of copper metal filled features, it will be appreciated that the invention applied to any metal used to fill an anisotropically etched feature formed in a dielectric insulating layer including for example, aluminum, copper, tungsten, and their alloys. The term 'copper' as used herein refers to copper or alloys thereof.

In a first embodiment of the invention a dielectric insulating layer is formed including active features including dummy features photolithographically patterned and formed in parallel with the metal filled active features the metal filled dummy features being formed adjacently to the active metal features to improve a polishing uniformity. The dummy features are formed to define an enclosed area as viewed in the wafer process surface plane having corner portions defining an angle theta that spans a portion of the enclosed area said corner portions having an angle of at least about 108 degrees. In another embodiment, there are at least about 5 corner portions defining the enclosed area.

Figure 1A:
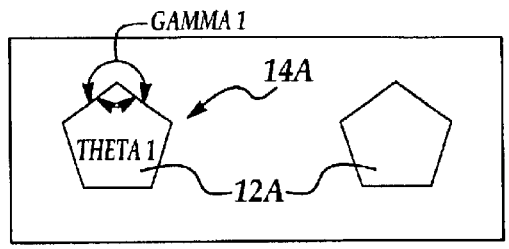
FIGS. 1A–1C are top in-wafer plane views of exemplary dummy features formed within a portion of a semiconductor wafer in exemplary embodiment of the present invention.

For example, referring to FIG. 1A, is shown a top planar view as viewed in the wafer plane of a portion of a wafer process surface including an exemplary embodiment of dummy features e.g., 12A. In this embodiment, the dummy feature includes corners as viewed in the wafer surface plane forming an angle e.g., theta 1 of at least about 108 degrees spanning a portion of the dummy feature at the dielectric insulating layer interface. The surrounding dielectric material area 14A forms a complimentary angle at the dielectric material/dummy feature interface, e.g., gamma 1 defining a portion of the dielectric insulating area 14A. For example, a pentagonally shaped dummy feature e.g., 12A satisfies the embodiment.

Figure 1B:
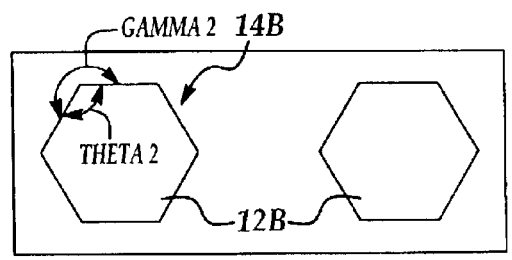

In another embodiment, for example, referring to FIG. 1B, is shown a top planar view as viewed in the wafer plane of a portion of a wafer process surface including another exemplary embodiment of dummy features e.g., 12B. In this embodiment, the dummy feature e.g., 12B includes corners as viewed in the wafer surface plane forming an angle e.g., theta 2 of at least 120 degrees spanning a portion of the dummy feature at the dielectric insulating layer interface.

The surrounding dielectric material area 14B forms a complimentary angle at the dielectric material/dummy feature interface, e.g., gamma 2 defining a portion of the dielectric insulating area 14B. For example, a hexagonally shaped dummy feature e.g., 12B satisfies the embodiment.

Figure 1C:
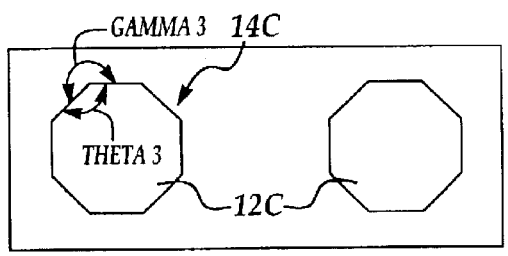

In another embodiment, for example, referring to FIG. 1C, is shown a top planar view as viewed in the wafer plane of a portion of a wafer process surface including another exemplary embodiment of the dummy features e.g., 12C. In this embodiment, the dummy feature e.g., 12C includes corners forming an angle e.g., theta 3 of at least 135 degrees defining a portion of the dummy feature at the dielectric insulating layer interface. The surrounding dielectric material area 14C forms a complimentary angle at the dielectric material/dummy feature interface e.g., gamma 3 defining a portion of the dielectric insulating area 14C. For example, an octagonally shaped dummy feature e.g., 12C satisfies this embodiment.

Figure 2A:
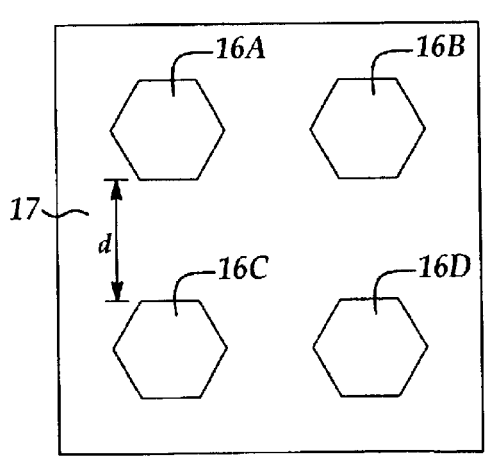
FIGS. 2A–2B are expanded top in-wafer plane views of exemplary portions of patterned arrays of dummy features formed within a portion of a semiconductor wafer in exemplary embodiment of the present invention.
Figure 2B:
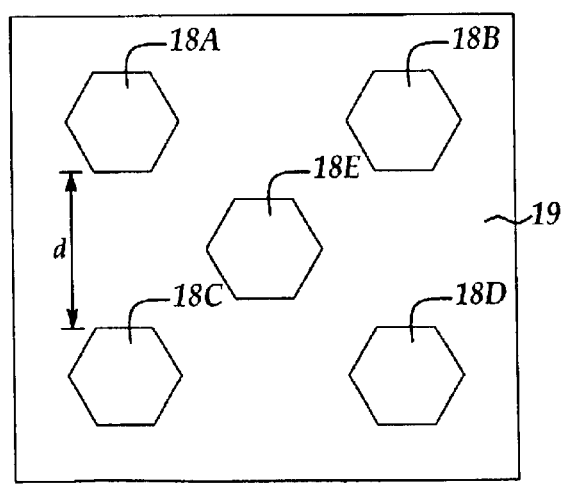

Referring to FIGS. 2A and 2B, in another embodiment, the dummy feature openings are formed in a patterned array within a relatively featureless area of the process surface. For example referring to FIG. 2A dummy features e.g., 16A, 16B, 16C, 16D, are formed in a patterned array within, for example, dielectric insulating layer 17. By 'patterned array' herein is meant any patterned feature spacing including regularly spaced repeating features or randomly spaced features of anisotropically etched dummy feature openings. For example, shown in FIG. 1 are dummy features e.g., 16A, 16B, 16C, 16D, patterned into regularly spaced repeating array, for example a rectangular array. Shown in FIG. 2 are dummy features e.g., 18A, 18B, 18C, 18D, 18E, patterned into a face-centered rectangular array within dielectric insulating layer 19, where a dummy feature e.g., 18A is centered with respect to at least one side of dummy features defining a rectangular shape, for example defined by dummy features 18A and 18B. Preferably, the patterned array is patterned such that the pitch between the dummy feature openings at the process surface approximates a pitch (feature spacing) and density of features (features per unit area) formed within active areas to approach a uniform density distribution of material with contrasting polishing rates over the wafer surface. For example, the spacing (pitch) between dummy features d is from about 1 dummy feature widths to about 10 dummy feature opening widths. Preferably, the anisotropically etched dummy feature openings have a maximum width as viewed in the wafer surface plane from about 0.1 microns to about 5 microns and are anisotropically etched to have a depth of from about 1000 Angstroms to about 10,000 Angstroms. For example, the anisotropically etched dummy feature openings preferably have about the same pitch (feature spacing) and surface area (feature density) as semiconductor features provided in the active areas to approach a more uniform feature density distribution.

It is believed that the formation of dummy features with both an increased number of corner portions where each corner portion defines an angle greater than about 108 degrees, for example, pentagonally, hexagonally, and octagonally shaped dummy features as viewed in the wafer plane, acts to locally distribute and lower the magnitude of stress per unit area at corner areas when subjected to a load, for example, such as CMP. For example, the larger number of corner portions essentially acts to divide the localized stress concentration among a larger number of corners thereby lowering the stress concentration present at any one corner, the most likely crack initiation sites. As a result, for a given load, the level of localized stress concentration is reduced thereby avoiding crack initiation and propagation. Thus, higher stress inducing processes including CMP processes may be carried out without cracking of the IMD layer. It has been found that the formation of pentagonally, hexagonally, and octagonally shaped dummy features reduces the incidence of IMD layer cracking thereby increasing a die yield and improving device reliability. In addition, it has been found that the dummy features of the present invention have an improved resistance to cracking from other stress inducing process including coefficient of thermal expansion (CTE) mismatches present in thermal cycling and loading present in bonding operations.

For example, the semiconductor wafer process surface includes a plurality of multi-level semiconductor devices, referred to as die, or active areas formed within a central portion of the semiconductor process wafer. In one embodiment, the active features and dummy features are metal filled features formed through a thickness portion of at least on dielectric insulating layer. For example, the metal filled dummy features are formed by first forming anisotropically etched openings in the dielectric insulating layer to form a pattern of openings in a process surface area having relatively less feature density (or devoid of active features) compared to an active area of higher density to approximate the feature density present in the active areas. It will be appreciated that the particular active area pattern density will vary depending on the features and circuit layout being formed at a particular manufacturing level of the device.

In exemplary operation, the dummy features are photolithographically patterned and anisotropically etched into an insulating dielectric layer, for example, an IMD layer having a dielectric constant less than about 3.2. There are several types of materials suitable for forming low dielectric constant (low-k) insulting dielectric layers that are known in the art. Exemplary low-k inorganic materials include carbon or fluorine doped silicon oxide, organo-silane glass, xerogels, and porous oxides. Exemplary low-k organic materials include polyarylene ether, hydrogen silesquioxane (HSQ) or methyl silsesquioxane (MSQ), polysilsequioxane, polyimide, benzocyclobutene, and amorphous polytetrafluoroethylene (PTFE).

Preferably the dummy feature openings are formed in the dielectric insulating layer at the process surface by conventional photolithographic patterning processes and reactive ion etching (RIE) processes. For example, the dummy feature openings are etched through a portion of the insulating dielectric layer to form closed communication with the insulating dielectric layer. For example, the dummy feature openings are formed providing no electrically conductive communication with an underlying semiconductor feature. Preferably, the dummy feature openings are photolithographically patterned and anisotropically etched in parallel with the formation of other semiconductor structures being formed in active areas of the die. For example, a special reticle (photomask) for photolithographic patterning the dummy features may be used in a separate photolithographic patterning process to pattern the dummy features in parallel with normal semiconductor feature patterning. Preferably, the dummy feature openings are subsequently filled with an adhesion/barrier lining followed by filling with metal by depositing a metal filling layer by conventional metal deposition processes including physical vapor deposition (PVD), chemical vapor deposition (CVD), electroplating, or combinations thereof which are known in the art.

Figure 3A:
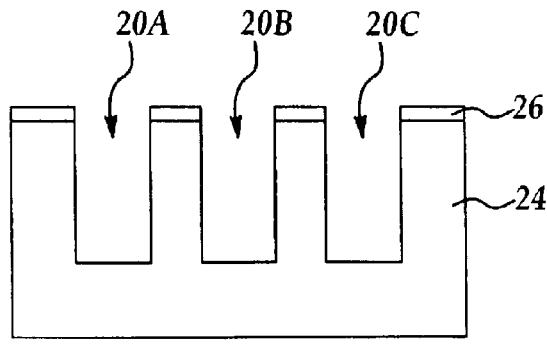
FIGS. 3A–3D are cross sectional side views of portions of a semiconductor device showing exemplary dummy features at stages of manufacture according to an embodiment of the present invention.

In an exemplary embodiment, the dummy features are first lined according to LPCVD with a refractory metal barrier/adhesion layer, for example, tantalum or tantalum nitride, followed by PVD deposition of a copper seed layer over which a copper filling is deposited according to known electroplating processes. For example, referring to FIG. 3A, is shown a cross-sectional representation of a portion of the process wafer at one level of a multi-level semiconductor device including exemplary dummy features. In an exemplary process, dummy feature openings e.g., 20A, 20B, 20C and are formed in an inter-metal dielectric (IMD), also referred to as an inter-layer dielectric (ILD) layer 24 within a relatively featureless portion of the wafer surface. The IMD layer 24 including the dummy feature openings e.g., 20A, 20B, 20C, is for example, formed of a low-k material, for example, carbon doped silicon dioxide, with a dielectric constant of less than about 3.2. The IMD layer 24 is typically formed by conventional CVD processes including PECVD and HDP-CVD with the IMD layer 24 typically about 3000 to about 10,000 Angstroms in thickness. Deposited over the (IMD) layer 24, there is typically formed a bottom antireflectance coating (BARC) layer 26 also functioning as an etching stop layer to reduce undesired light reflections in a photolithographic process, for example silicon oxynitride or silicon oxycarbide.

The dummy feature openings e.g., 20A, 20B, 20C are preferably formed by a photolithographic patterning step including a separately formed photomask for patterning the dummy feature openings either separately or in parallel with photolithographic patterning of other semiconductor features in active areas. Following photolithographic patterning, a conventional reactive ion etch (RIE) step is performed where the dummy feature openings are preferably etched in parallel with other patterned semiconductor features patterned in active areas.

Figure 3B:
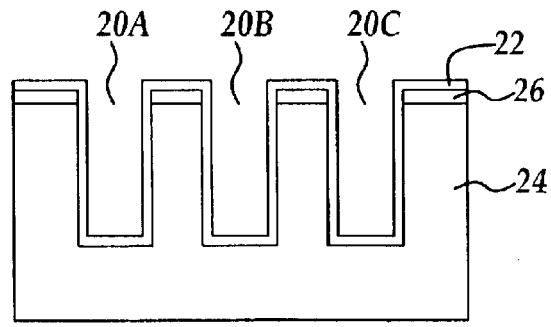

Referring to FIG. 3B, prior to filling the dummy feature openings e.g., 20A, 20B, 20C, with, for example, copper, a barrier/adhesion layer 22 of, for example, tantalum nitride (e.g., TaN) is blanket deposited over the dummy feature openings e.g., 20A, 20B, 20C to line the dummy feature opening. The barrier/adhesion layer 22 is formed to prevent diffusion of the fill metal, for example, copper, into the insulating IMD layer 24. The barrier/adhesion layer 22 is formed by a conventional CVD process, fore example LPCVD.

Figure 3C:
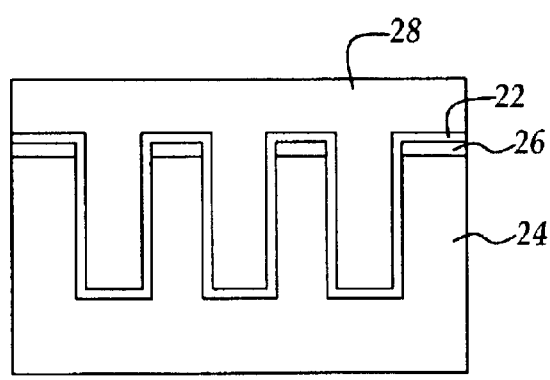

Referring to FIG. 3C, prior to performing an electroplating process to fill the semiconductor feature openings including the dummy feature openings e.g., 20A, 20B, 20C, with a metal, for example copper, a copper seed layer (not shown) is deposited over the barrier/adhesion layer 22. The copper seed layer provides improved adhesion for subsequently electrodeposited metal layers, as well as a continuous conductive layer for electrodeposition of an overlying metal layer. A copper fill layer 28 is electroplated by conventional electrodeposition methods over the copper seed layer (not shown) to completely fill the dummy via openings e.g., 20A, 20B, 20C, including a copper layer overlying the barrier/adhesion layer 22A.

Figure 3D:
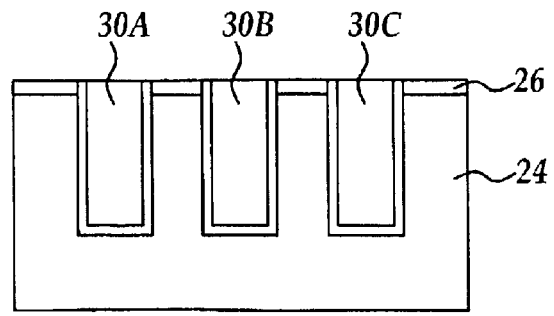

Referring to FIG. 3D, following the electroplating process, the copper layer 28 is then planarized, preferably by a conventional multiple step CMP process to first remove excess copper overlying the barrier/adhesion layer 22 followed by removal of the barrier/adhesion layer 22 to form copper filled dummy features e.g., 30A, 30B, 30C. According to the present invention following the CMP process the wafer process surface includes an improved local or within-wafer-die (WID) planar uniformity without the formation of cracks within the IMD layer as a result of dummy features formed according to preferred embodiments of the present invention.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for improving CMP polishing uniformity and reducing or preventing cracking in a semiconductor wafer process surface by reducing stress concentrations adjacent to dummy features comprising the steps of:

provioding a semiconductor wafer process surface comprising active features and dummy features formed adjacently to the active features to improve a CMP polishing uniformity said dummy features each shaped to define an enclosed area in said semiconductor wafer process surface plane comprising at least 5 corner portions, wherein the dummy features are formed in a non-active area portion of a die devoid of active features to approximate an active feature pitch and density; and, performing a CMP process on said semiconductor wafer process surface.

2. The method of claim 1, wherein the active features and the dummy features comprise metal filled features are formed to penetrate a thickness portion of at least one dielectric insulating layer.

3. The method of claim 2, wherein the at least one dielectric insulating layer is selected from the group consisting of carbon doped silicon oxide, fluorine doped silicon oxide, organo-silane glass, porous oxides, polyarylene ether, hydrogen silesquioxane (HSQ), methyl silsesquioxane (MSQ), polysilsequioxane, polyimide, benzocyclobutene, and amorphous polytetrafluoroethylene (PTFE).

4. The method of claim 2, wherein the metal filled features are filled with a metal selected from the group consisting of aluminum, copper, and tungsten.

5. The method of claim 1, wherein each of the at least 5 corner portions defines an angle theta equal to or greater than about 108 degrees spanning at least a portion of the dummy feature.

6. The method of claim 5, wherein each of the at least 5 corner portions defines the angle theta equal to or greater than about 120 degrees.

7. The method of claim 5, wherein each of the at least 5 corner portions defines the angle theta equal to or greater than about 135 degrees.

8. The method of claim 1, wherein the dummy features include at least one geometrically shaped member selected from the group consisting of a pentagon, a hexagon, and an octagon.

9. The method of claim 1, wherein the dummy features comprise a patterned array selected from the group consisting of a regularly repeating array and a randomly repeating array.

10. The method of claim 9, wherein the patterned array comprises dummy features spaced apart from one another from about 1 to about 10 dummy feature widths.

11. The method of claim 10, wherein the patterned array comprises dummy features having uniform spacing widths between the dummy features.

12. A method for reducing or preventing cracking of a dielectric insulating layer by reducing stress concentrations at a dielectric insulating layer/metal filled dummy feature interface comprising the steps of:

providing a semiconductor process wafer comprising metal filled active features and metal filled dummy features formed through a thickness portion of at least one dielectric insulating layer said metal filled dummy features formed adjacently to the metal filled active features to improve a CMP polishing uniformity each said metal filled dummy feature shaped to define an enclosed area as viewed in the semiconductor process wafer plane comprising corner portions defining an angle theta of at least about 108 degrees spanning at least a portion of the enclosed area; and, performing a CMP process on the semiconductor process wafer.

13. The method of claim 12, wherein the at least one dielectric insulating layer is selected from the group consisting of carbon doped silicon oxide, fluorine doped silicon oxide, organo-silane glass, porous oxides, polyarylene ether, hydrogen silesquioxane (HSQ), methyl silsesquioxane (MSQ) polysilsequioxane, polyimide, benzocyclobutene, and amorphous polytetrafluoroethylene (PTFE).

14. The method of claim 12, wherein the metal filled features are filled with a metal selected from the group consisting of aluminum, copper, and tungsten.

15. The method of claim 12, wherein the corner portions define an angle theta of at least about 120 degrees spanning a portion of the enclosed area.

16. The method of claim 12, wherein the corner portions define an angle theta of at least about 135 degrees spanning a portion of the enclosed area.

17. The method of claim 12, wherein the metal filled dummy features include at least one member selected from the group of geometric shapes consisting of a pentagon, a hexagon, and an octagon.

18. The method of claim 1, wherein the metal filled dummy features are formed in non-active areas of a die to approximate a metal filled active feature surface area and pitch.

19. The method of claim 1, wherein the metal filled dummy features are formed in a non-active area portion of a die to form a patterned array selected from the group consisting of a randomly spaced array and a regularly spaced repeating array.

* * * * *